(12) United States Patent
Cheng et al.

(10) Patent No.: US 9,917,199 B2
(45) Date of Patent: Mar. 13, 2018

(54) METHOD FOR REDUCED PARASITIC CAPACITANCE AND CONTACT RESISTANCE IN EXTREMELY THIN SILICON-ON-INSULATOR (ETSOI) DEVICES DUE TO WRAP-AROUND STRUCTURE OF SOURCE/DRAIN REGIONS

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/439,078

(22) Filed: Feb. 22, 2017

(65) Prior Publication Data
US 2017/0271525 A1      Sep. 21, 2017

Related U.S. Application Data

(62) Division of application No. 15/072,920, filed on Mar. 17, 2016, now Pat. No. 9,735,173.

(51) Int. Cl.
| | |
|---|---|
| *H01L 27/12* | (2006.01) |
| *H01L 29/786* | (2006.01) |
| *H01L 21/84* | (2006.01) |
| *H01L 29/08* | (2006.01) |
| *H01L 29/66* | (2006.01) |

(52) U.S. Cl.
CPC ........ *H01L 29/78618* (2013.01); *H01L 21/84* (2013.01); *H01L 29/0847* (2013.01); *H01L 29/66742* (2013.01); *H01L 29/78603* (2013.01)

(58) Field of Classification Search
CPC ..... H01L 21/823418; H01L 21/823425; H01L 27/1203; H01L 27/12
See application file for complete search history.

(56) References Cited

U.S. PATENT DOCUMENTS

| | | | |
|---|---|---|---|
| 7,479,437 B2 | 1/2009 | Greene et al. | |
| 7,871,869 B2 | 1/2011 | Cartier et al. | |
| 8,012,820 B2 | 9/2011 | Majumdar et al. | |

(Continued)

OTHER PUBLICATIONS

List of IBM Patents or Patent Applications Treated as Related dated Feb. 22, 2017, 2 pages.

(Continued)

*Primary Examiner* — Andrew Q Tran
(74) *Attorney, Agent, or Firm* — Tutunjian & Bitetto, P.C.; Vazken Alexanian

(57) ABSTRACT

A method for forming a semiconductor device includes etching a semiconductor layer using a gate structure and spacers as a mask to protect portions of the semiconductor layer that extend beyond the gate structure. Undercuts are formed in a buried dielectric layer under the gate structure. Source and drain regions are epitaxially growing and wrapped around the semiconductor layer by forming the source and drain regions adjacent to the gate structure on a first side of the semiconductor layer and in the undercuts on a second side of the semiconductor layer opposite the first side.

20 Claims, 6 Drawing Sheets

(56) References Cited

U.S. PATENT DOCUMENTS

| | | |
|---|---|---|
| 8,486,778 B2 | 7/2013 | Haran et al. |
| 8,492,854 B1 | 7/2013 | Cheng et al. |
| 8,574,970 B2 | 11/2013 | Cheng et al. |
| 8,841,189 B1 | 9/2014 | Cheng et al. |
| 8,877,604 B2 | 11/2014 | Adam et al. |
| 8,916,443 B2 | 12/2014 | Adam et al. |
| 9,735,173 B1 * | 8/2017 | Cheng ................. H01L 27/1203 |

OTHER PUBLICATIONS

Cheng, K. et al., "Extremely Thin SOI (ETSOI) Technology: Past, Present, and Future" IEEE (2010) pp. 1-4.

* cited by examiner

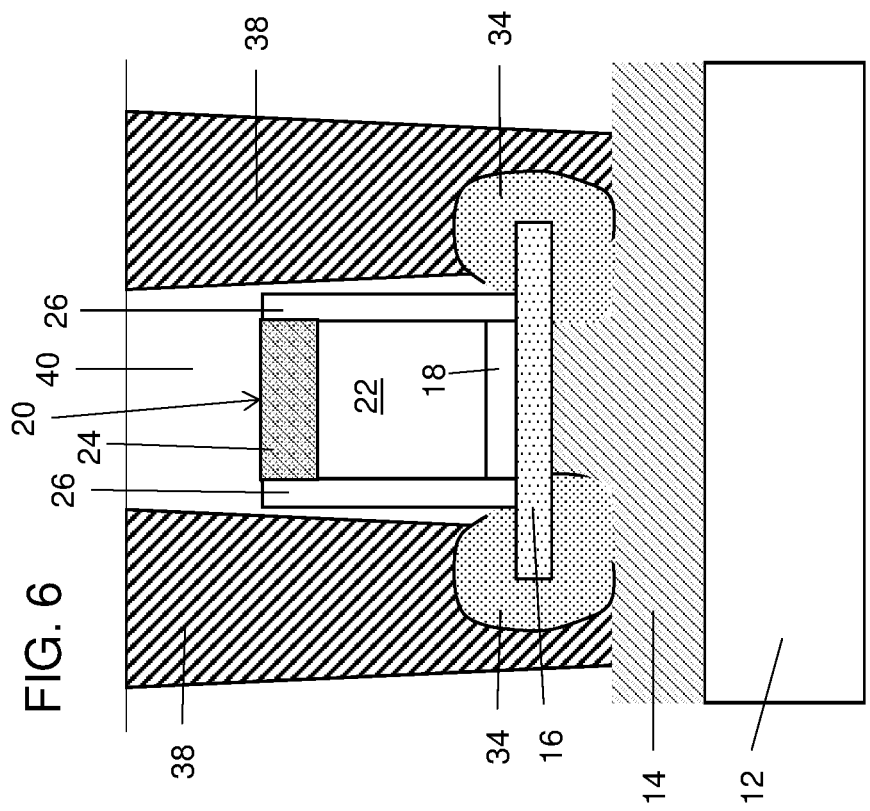
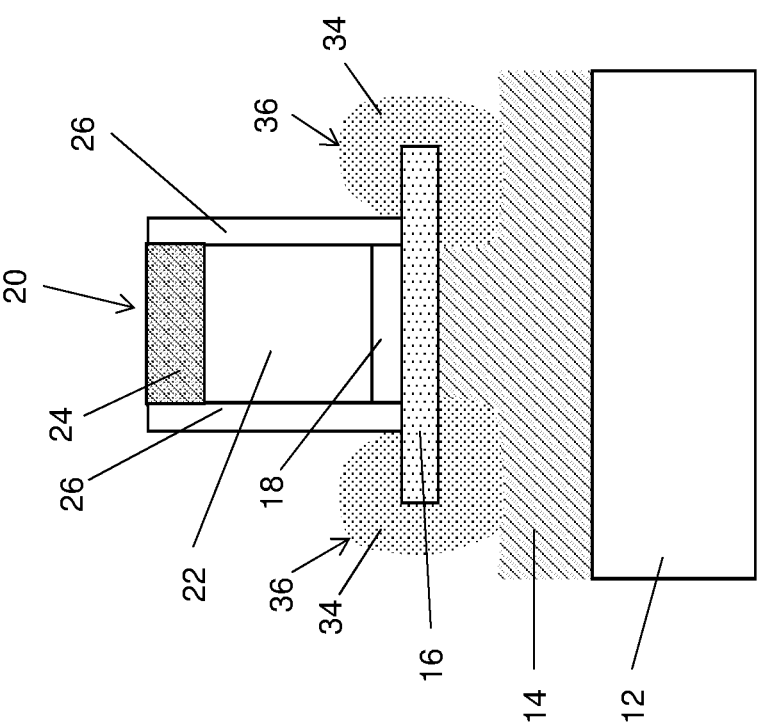

METHOD FOR REDUCED PARASITIC CAPACITANCE AND CONTACT RESISTANCE IN EXTREMELY THIN SILICON-ON-INSULATOR (ETSOI) DEVICES DUE TO WRAP-AROUND STRUCTURE OF SOURCE/DRAIN REGIONS

BACKGROUND

Technical Field

The present invention relates to semiconductor devices and processing, and more particularly to devices and methods that include source and drain regions that surround (wrap-around) an extremely thin semiconductor-on-insulator (ETSOI) channel area.

Description of the Related Art

In-situ doped epitaxy source and drain (S/D) regions followed by a diffusion anneal has been shown to form damage-free and lower resistance extension regions compared with implanted extension regions for field effect transistor (FET) devices. However, to ensure enough dopants are present in the S/D epitaxy, the S/D epitaxy region has to be large enough (e.g., thick enough to ensure sufficient dopants). Large (thick) S/D epitaxy undesirably increases the parasitic capacitance between a gate and the S/D epitaxy. For example, in raised S/D epitaxy regions, thick S/D materials are formed above the channel region resulting in high gate to S/D overlap capacitance. Another challenge with ETSOI is to form low contact resistance.

SUMMARY

A semiconductor device includes a buried dielectric layer and a semiconductor layer provided on the buried dielectric layer. A gate structure is formed on the semiconductor layer and has portions of the semiconductor layer extending beyond the gate structure. Source and drain regions are wrapped around ends of the semiconductor layer such that a first portion of the source and drain regions is formed on a first side of the semiconductor layer adjacent to the gate structure and a second portion of the source and drain regions is formed on a second side of the semiconductor layer opposite the first side.

Another semiconductor device includes an extremely thin semiconductor-on-insulator (ETSOI) substrate including a base substrate, a buried dielectric layer and a semiconductor layer provided on the buried dielectric layer. A gate structure is formed on the semiconductor layer, and an active area region is formed by the semiconductor layer and has end portions extending beyond the gate structure on lateral sides. Source and drain regions are formed over and below the end portion of the active area to wrap around the end portions such that a first portion of the source and drain regions is formed on a first side of the semiconductor layer adjacent to the gate structure and a second portion of the source and drain regions is formed on a second side of the semiconductor layer opposite the first side.

A method for forming a semiconductor device includes forming a gate structure on a semiconductor layer, the semiconductor layer being formed on a buried dielectric layer; forming first spacers on sides of the gate structure; forming second spacers on the first spacers; etching the semiconductor layer using the second spacers as a mask to protect portions of the semiconductor layer that extend beyond the gate structure; forming undercuts in the buried dielectric layer under the gate structure; and epitaxially growing source and drain regions wrapped around the semiconductor layer by forming the source and drain regions adjacent to the gate structure on a first side of the semiconductor layer.

Another method for forming a semiconductor device includes etching a semiconductor layer using a gate structure and spacers as a mask to protect portions of the semiconductor layer that extend beyond the gate structure. Undercuts are formed in a buried dielectric layer under the gate structure. Source and drain regions are epitaxially growing and wrapped around the semiconductor layer by forming the source and drain regions adjacent to the gate structure on a first side of the semiconductor layer and in the undercuts on a second side of the semiconductor layer opposite the first side.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 5 is a cross-sectional view of the semiconductor device of FIG. 4 showing epitaxially grown source and drain regions formed over end portions of the semiconductor layer, the source and drain regions being formed above and below the semiconductor layer to wrap around the semiconductor layer in accordance with the present principles;

FIG. 6 is a cross-sectional view of the semiconductor device of FIG. 5 showing contacts formed to connect to the source and drain regions, the contacts being formed over a top and side(s) of the epitaxially grown source and drain regions in accordance with the present principles;

DETAILED DESCRIPTION

Figure 2:
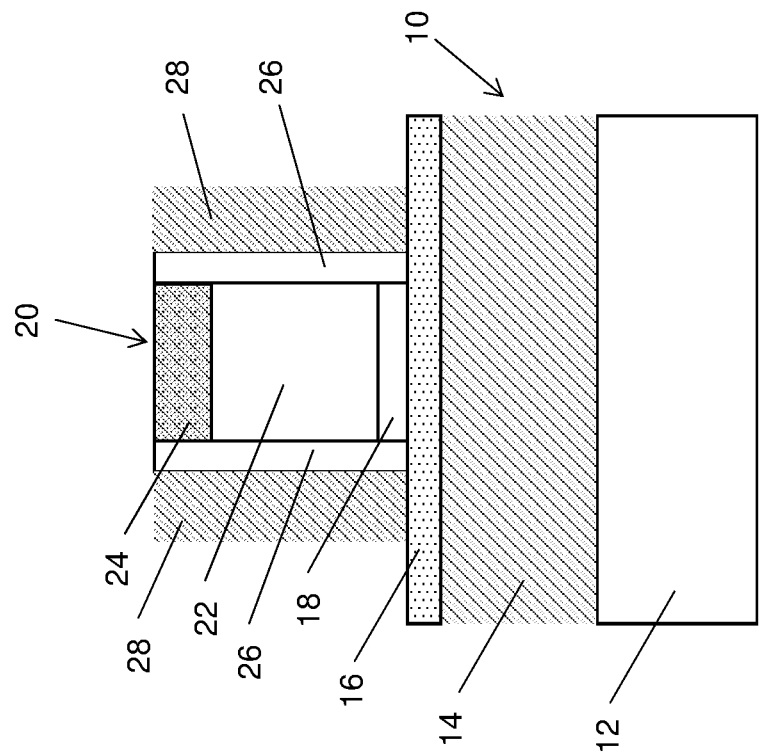
FIG. 2 is a cross-sectional view of the semiconductor device of FIG. 1 showing first spacers and second spacers formed on the gate structure in accordance with the present principles.

In accordance with the present principles, methods and devices are provided that include wrap-around source and drain (S/D) regions. By providing S/D regions on top and bottom of an active area (channel), the volume of dopants present is increased. In addition, the height of the S/D regions is lower and below the gate structure, which tends to reduce parasitic capacitances with the gate structure (e.g., reduce overlap capacitances). The devices in accordance with the present principles may include metal oxide semiconductor (MOSFET) devices that include reduced parasitic capacitance due to the wrap-around structure.

In one embodiment, improved contact resistance is also achieved by forming contacts to the wrap-around structure that contacts tops and one or more sides of the wrap-around structure. In another embodiment, a structure includes an extremely thin semiconductor-on-insulator (ETSOI) substrate. Sharp junctions are formed, and low resistance S/D regions provide high performance devices with the ETSOI substrate.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
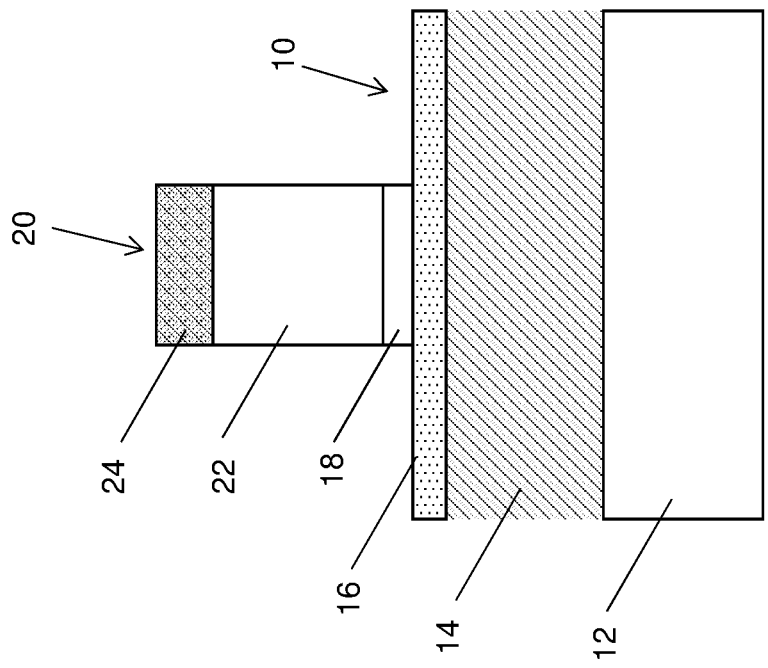
FIG. 1 is a cross-sectional view of a semiconductor device showing a gate structure formed on an extremely thin semiconductor-on-insulator (ETSOI) substrate in accordance with the present principles.

Referring now to the drawings in which like numerals represent the same or similar elements and initially to FIG. 1, an ETSOI substrate 10 is shown having a gate structure 20 formed thereon for implementing the present principles. The substrate 10 includes a base substrate 12, a buried dielectric 14 and an extremely thin semiconductor layer 16, which will be referred to hereinafter as the thin layer or the semiconductor layer 16 for ease of reference.

The base substrate 12 may include any suitable substrate material. In particularly useful embodiments, the base substrate 12 includes Si, SiGe, SiC, Ge, a III-V material (e.g., InP, InGaAs, GaAs, etc.) or any other suitable substrate material. The buried dielectric 14 may include an oxide, a nitride or any other suitable dielectric material. The buried dielectric 14 is employed to provide isolation for transistor devices (or any other device) formed in the thin layer 16.

The thin layer 16 includes a semiconductor material. The semiconductor material may include Si, Ge, SiGe, SiC, a III-V material (e.g., InP, InGaAs, GaAs, etc.) or any other suitable material. In useful embodiments, the thin layer 16 includes monocrystalline Si. The thin layer 16 will form a channel for transistor device embodiments.

The gate structure 20 includes a gate dielectric 18, which may include an oxide, a nitride, a high-k oxide or combinations of materials. A metal gate conductor 22 includes conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), a carbon nanotube, conductive carbon, graphene, or any suitable combination of these materials. The conductive material may further comprise dopants that are incorporated during or after deposition. A gate cap 24 may include a nitride, such as silicon nitride (SiN). The layers 18, 22 and 24 may be deposited on each other and etched in accordance with a hard mask or resist pattern using a lithographic patterning process.

Referring to FIG. 2, a first spacer layer deposition is performed. The first spacer layer may include, e.g., SiN and be deposited using a chemical vapor deposition process. Other materials and deposition processes are also contemplated. After deposition, a reactive ion etch (RIE) is performed to remove the first spacer layer from horizontal surfaces and to form first spacers 26.

A second spacer layer is deposited. The second spacer layer may include, e.g., an oxide and be deposited using a chemical vapor deposition process. Other materials and deposition processes are also contemplated. After deposition, a RIE is performed to remove the second spacer layer from horizontal surfaces and to form second spacers 28. The second spacers 28 include a material that can be selectively etched relative to the first spacers 26 and the gate cap 24. The second spacers 28 include a thickness that may be larger than the thickness of the first spacers 26. The thickness of the second spacers 28 preserves and defines a length of the semiconductor layer 16 (channel) to be employed for the device. The thicker the second spacers 28 the longer the channel dimension.

Figure 3:
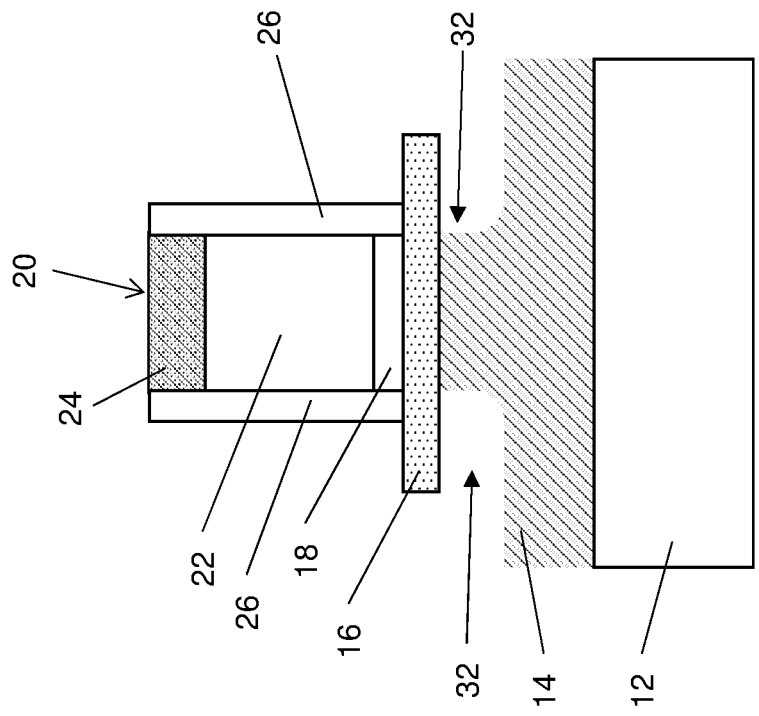
FIG. 3 is a cross-sectional view of the semiconductor device of FIG. 2 showing the first spacers and/or the second spacers employed as an etch mask to remove portions of a semiconductor layer of the ETSOI substrate in accordance with the present principles.

Referring to FIG. 3, an etch process is performed to remove the semiconductor layer 16 outside the second spacers 28. The etch process may include a RIE etch where etchants 30 are directed to remove the portion of the semiconductor layer 16 of the ETSOI substrate 10 selective to the buried dielectric 14 and second spacers 28 layer.

Figure 4:
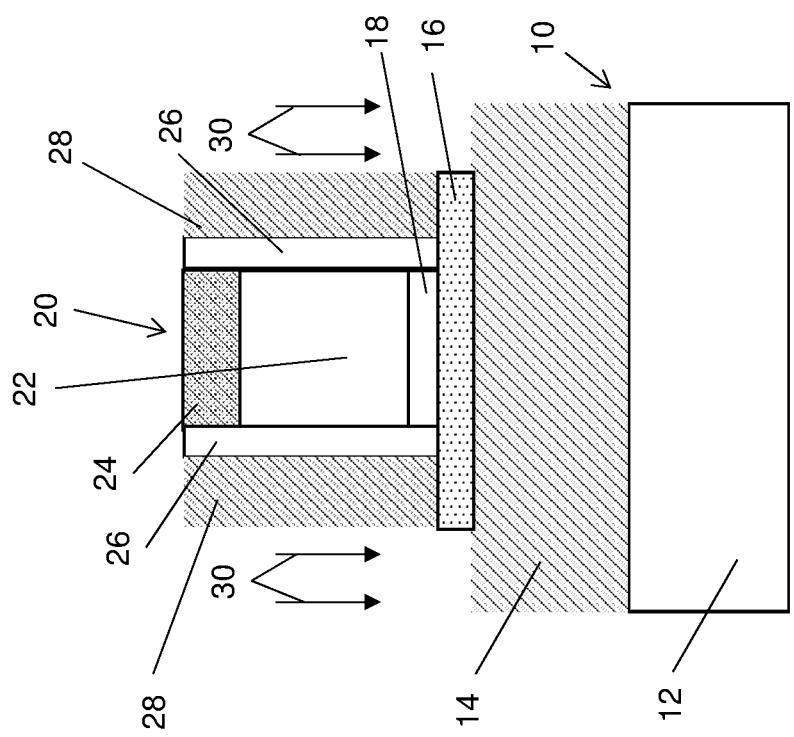
FIG. 4 is a cross-sectional view of the semiconductor device of FIG. 3 showing the second spacers removed and undercuts formed below the semiconductor layer by performing an etch process, the undercuts extending underneath the gate structure in accordance with the present principles.

Referring to FIG. 4, a selective etch is performed to remove the second spacers 28 and to form undercuts 32 in the buried dielectric layer 14. In one embodiment, the second spacers 28 and the buried dielectric layer 14 are formed from oxide and are therefore removed with an oxide etch. The oxide etch may include a dry or wet etch. The etch is timed to permit the undercuts 32 to extend below the semiconductor layer 16 and even below the gate structure 20. In one embodiment, the undercuts 32 extend to about a position of an inner surface of the first spacers 26. The undercuts 32 may extend beyond the inner surface (e.g., surface of the first spacers 26 in contact with the gate conductor 22) of the first spacers 26 or may extend less than the inner surface of the first spacers 26.

Referring to FIG. 5, an in-situ doped source/drain (S/D) epitaxy growth process is performed to grow S/D regions 34 around the semiconductor layer 16. Since surfaces of the semiconductor layer 16 have been exposed on both a top side and a bottom side, the epitaxial growth occurs around the end position of the semiconductor layer 16. This is referred to herein as a wrap-around structure. The S/D regions 34 may be grown concurrently and then individually doped by implantation, dopant diffusion or other process. In one embodiment, the S/D regions 34 are formed sequentially for different types of transistors, for example, n-type MOSFET and p-type MOSFET, by using blocking masks and doped in-situ during formation.

The S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRP-CVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ to $1\times10^{21}$ cm$^{-3}$. When Si:C is epitaxially grown, the Si:C layer may include carbon in the range of 0.2 to 3.0%. When SiGe is epitaxially grown, the SiGe may have germanium content in the range of 5% to 80%, or preferably between 20% and 60%.

The terms "epitaxial growth and/or deposition" and "epitaxially formed and/or grown," mean the growth of a semiconductor material (crystalline material) on a deposition surface of another semiconductor material (crystalline material), in which the semiconductor material being grown (crystalline over layer) has substantially the same crystalline characteristics as the semiconductor material of the deposition surface (seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

The S/D regions 34 wrap-around exposed portions of the semiconductor layer 16. The wrap-around structure of the S/D regions 34 provides sufficient volume and therefore sufficient dopant amounts for the S/D regions 34. The wrap-around structure exists below the semiconductor layer 16, and a portion 36 that exists above the semiconductor layer 16 includes a much smaller height than conventional devices. The portion 36 includes a low profile where the height is much less than conventional raised S/D regions. In this way, parasitic capacitance with the gate conductor 22 is dramatically reduced.

An anneal process may be performed to diffuse dopants from S/D regions into the semiconductor layer 16 to form extension regions. Dopant diffusion occurs from both sides of semiconductor layer, so potentially, a low thermal anneal can be employed to form a sharper junction. A sharper junction refers to a junction with well-defined or abrupt dopant concentration at or near the junction. In one embodiment, a low thermal anneal may include temperatures between about 600° C. to about 1100° C., for a 10 nanoseconds to about 30 minutes. The anneal process may include a laser anneal, spike anneal, rapid thermal anneal, flash anneal, furnace anneal, or any suitable combination of these techniques.

Referring to FIG. 6, an interlevel dielectric (ILD) layer 40 is formed over the gate structure 20 and S/D regions 34. The ILD 40 may include a silicon oxide or other suitable dielectric material. The ILD 40 is patterned to form contact holes down to the S/D regions 34. In one particularly useful embodiment, the contact holes are positioned to fall on top of and on one or more lateral sidewalls of the S/D regions 34.

Contacts 38 are formed be depositing any suitable conductive material in the contact holes. The contact material may include, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

In one embodiment, the contacts 38 are formed on top and on sidewalls of the S/D regions 34. In this way, contact area is significantly increased, which reduces contact resistance.

Figure 7:
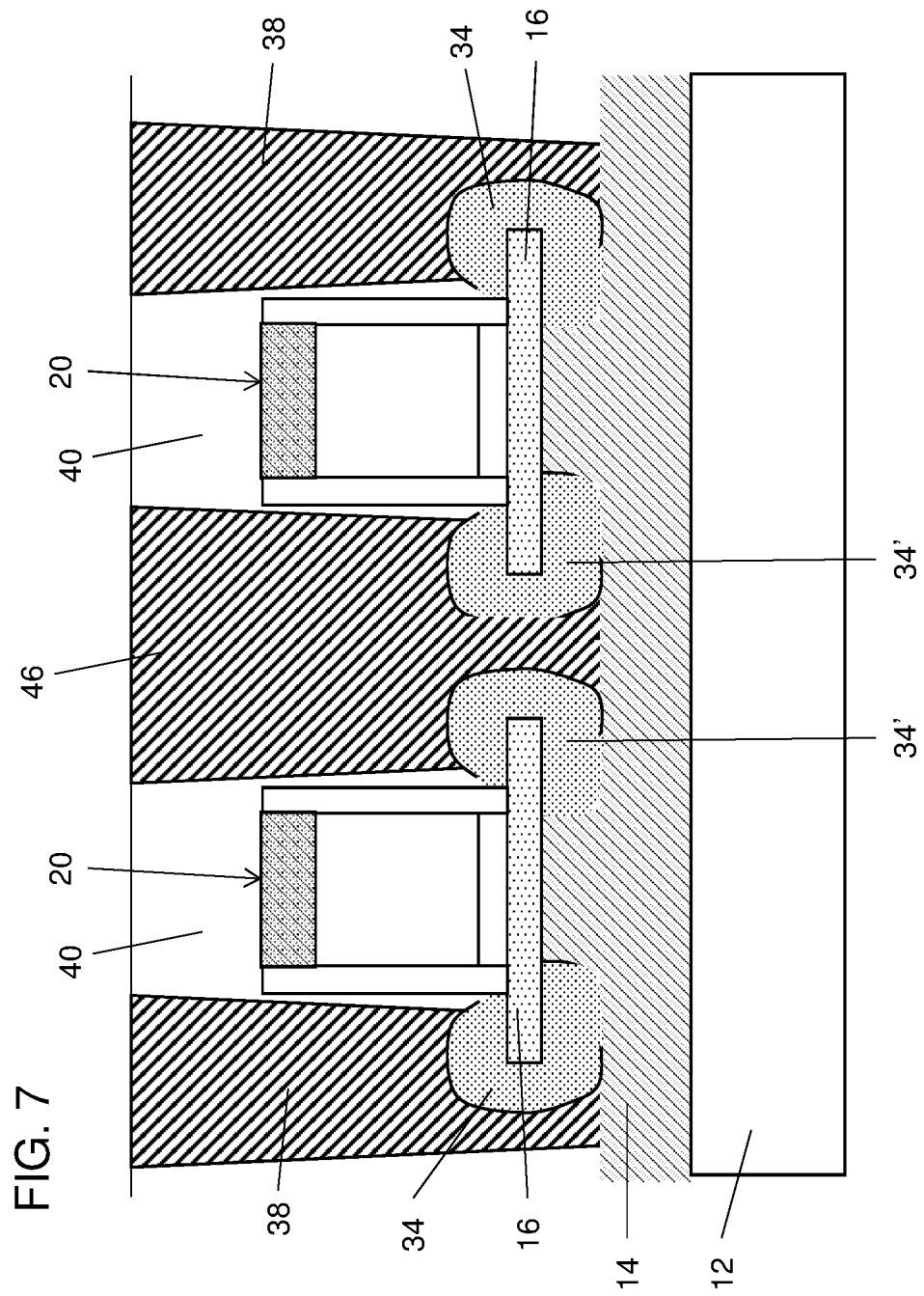
FIG. 7 is a cross-sectional view of a semiconductor device showing a shared or common contact that connects the source and drain regions of adjacent field effect transistor devices in accordance with the present principles.

Referring to FIG. 7, in alternate embodiments, a contact 46 may be formed to connect to two transistor devices 42 and 44 together. In one embodiment, the epitaxial growth of S/D regions 34 may be increased to blend a single source or drain region together. As depicted in FIG. 7, the contact 46 may be formed to connect two source/drain regions 34' to connect FETs 42, 44 to share a common S/D region and connect two separate epitaxial regions 34' together.

Figure 8:
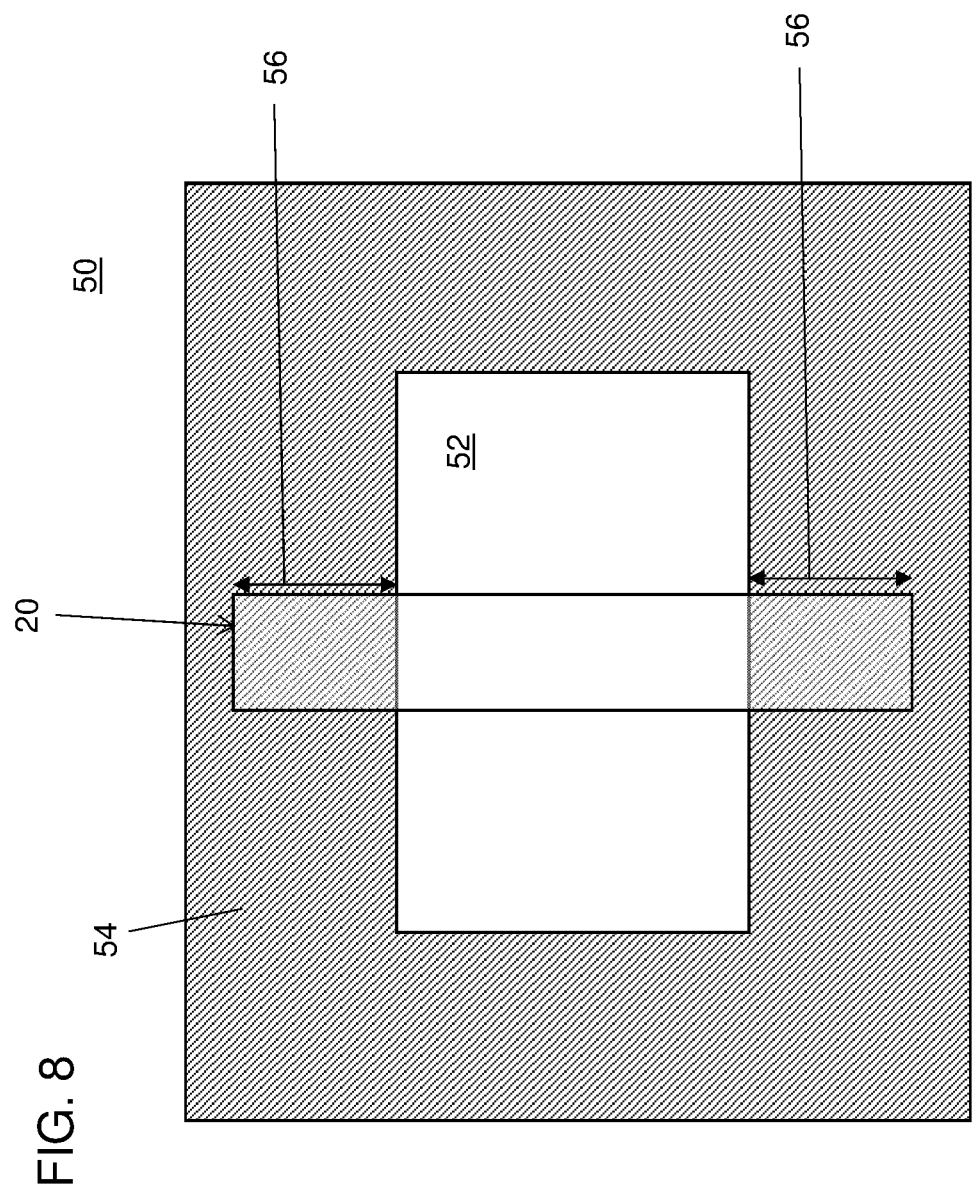
FIG. 8 is a top view of a semiconductor device showing a gate structure extending beyond an active region to reduce or eliminate electrical shorts due to the epitaxially grown source and drain regions in accordance with the present principles.

Referring to FIG. 8, a top view of a device 50 is shown in accordance with one illustrative embodiment. A gate structure 20 traverses an active region 52. The active region 52 includes the semiconductor layer 16. The active region 52 is surrounded by a shallow trench isolation (STI) region 54. To prevent source/drain epitaxial shorts, the gate structure 20 needs to extend beyond an edge of the active region 52 more than a lateral undercut of the buried dielectric layer 14 (FIG. 4) plus process margin. An extension distance 56 extends beyond the edge of the active region 52 by more than the lateral undercut plus process margin on both sides of the active region 52. For example, if the lateral undercut is 20 nm, the gate 20 needs to extend beyond active region 52 by about 40 nm. Alternatively, a gate cut may be performed after epitaxy. In this way, any access epitaxial materials at the end of the gate structure 20 are removed and/or replaced with dielectric materials.

Figure 9:
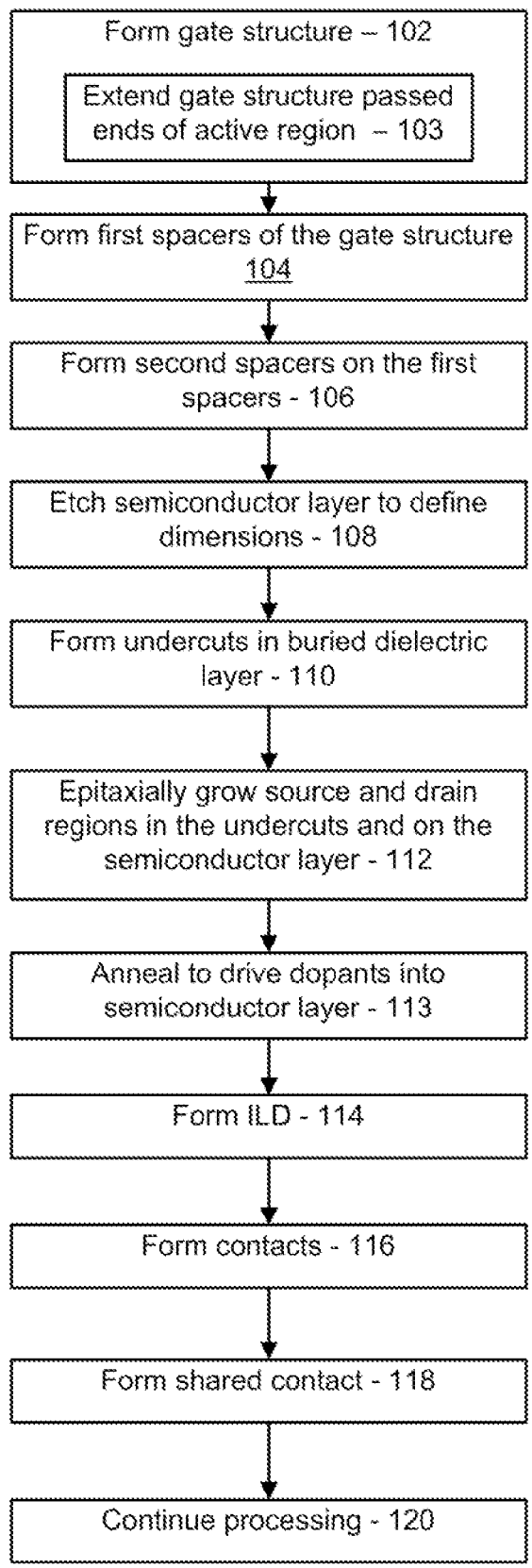
FIG. 9 is a block/flow diagram showing methods for fabricating a semiconductor device in accordance with illustrative embodiments.

Referring to FIG. 9, methods for forming a semiconductor device are described in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a gate structure is formed on a semiconductor layer. The semiconductor layer is formed on a buried dielectric layer. The semiconductor layer may include an extremely thin semiconductor layer of an extremely thin semiconductor-on-insulator (ETSOI) structure. In one embodiment, the gate structure is formed to longitudinally extend beyond the semiconductor layer to avoid electrical shorting on end portions of the gate structure, in block 103. This is to bring the gate structure passed the semiconductor layer at the end portions of the gate structure (see FIG. 8).

In block 104, first spacers are formed on sides of the gate structure. The first spacers may include SiN or other dielectric material. In block 106, second spacers are formed on the first spacers. The second spacers may include an oxide. The materials of the first and second spacers may be altered/selected to permit selective etching of one material relative to the other.

In block 108, the semiconductor layer below the gate structure is etched using the second spacers as a mask to protect portions of the semiconductor layer that extend beyond the gate structure. The thickness of the first and second spacers defines a length of the semiconductor layer (channel). In block 110, undercuts are formed in the buried dielectric layer under the gate structure. The undercuts are formed by an etching process that removes material selective to the semiconductor layer and burrows beneath the semiconductor layer underneath the gate structure. The same etch process may remove the second spacers as well. In one embodiment, the undercuts extend to a position underneath the gate structure, below the semiconductor layer.

In block 112, source and drain regions are epitaxially grown and wrap around the semiconductor layer by forming the source and drain regions adjacent to the gate structure on a first side (e.g., top) of the semiconductor layer and in the undercuts on a second side (e.g., bottom) of the semiconductor layer opposite the first side. In block 113, an anneal process may be performed to drive dopants from the source and drain regions into the semiconductor layer. In one embodiment, a low thermal anneal may include temperatures between about 600° C. to about 1100° C., for a 10 nanoseconds to about 30 minutes. The anneal process may include a laser anneal, spike anneal, rapid thermal anneal, flash anneal, furnace anneal, or any suitable combination of these or other techniques. In block 114, an ILD is formed and patterned to open contact holes down to the source and drain regions. In block 116, contacts are formed to connect to the source and drain regions. In one embodiment the contacts connect to a top and side(s) of the source and drain regions to reduce contact resistance. The contacts may connect to a top and more than one side of the source and drain regions. In block 118, a common contact to source and drain regions may be formed to connect adjacent devices and to share the common contact between the adjacent devices. In block 120, processing continues to complete the device(s).

Having described preferred embodiments for reduced parasitic capacitance and contact resistance in ETSOI devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor device, comprising:
    forming a gate structure on a semiconductor layer, the semiconductor layer being formed on a buried dielectric layer;
    forming first spacers on sides of the gate structure;
    forming second spacers on the first spacers;
    etching the semiconductor layer using the second spacers as a mask to protect portions of the semiconductor layer that extend beyond the gate structure;
    forming undercuts in the buried dielectric layer under the gate structure; and
    epitaxially growing source and drain regions wrapped around the semiconductor layer by forming the source and drain regions adjacent to the gate structure on a first side of the semiconductor layer and in the undercuts on a second side of the semiconductor layer opposite the first side.

2. The method as recited in claim 1, further comprising forming a common contact to source and drain regions of adjacent devices to share the common contact between the adjacent devices.

3. The method as recited in claim 1, wherein forming undercuts includes extending the undercuts to underneath the gate structure below the semiconductor layer.

4. The method as recited in claim 1, further comprising forming contacts to connect to the source and drain regions, the contacts connecting to a top and side of the source and drain regions to reduce contact resistance.

5. The method as recited in claim 1, wherein forming the gate structure includes longitudinally extending the gate structure beyond the semiconductor layer to avoid electrical shorting.

6. The method as recited in claim 1, wherein the semiconductor layer includes an extremely thin semiconductor layer of an extremely thin semiconductor-on-insulator (ETSOI) structure.

7. The method as recited in claim 1, further comprising annealing the source and drain regions to drive dopants into the semiconductor layer.

8. The method as recited in claim 1, wherein forming the second spacers includes defining a length of the semiconductor layer based on a thickness of the second spacers.

9. The method as recited in claim 1, wherein forming the undercuts includes performing a selective etch to remove the second spacers and to form the undercuts in the buried dielectric layer.

10. The method as recited in claim 1, wherein epitaxially growing includes growing a wrap-around structure for the source and drain regions with a low profile where a height of a top portion of the wrap-around structure is less than conventional raised source/drain regions.

11. A method for forming a semiconductor device, comprising:
    etching a semiconductor layer using a gate structure and spacers as a mask to protect portions of the semiconductor layer that extend beyond the gate structure;
    forming undercuts in a buried dielectric layer under the gate structure; and
    epitaxially growing source and drain regions wrapped around the semiconductor layer by forming the source and drain regions adjacent to the gate structure on a first side of the semiconductor layer and in the undercuts on a second side of the semiconductor layer opposite the first side.

12. The method as recited in claim 11, further comprising forming a common contact to source and drain regions of adjacent devices to share the common contact between the adjacent devices.

13. The method as recited in claim 11, wherein forming undercuts includes extending the undercuts to underneath the gate structure below the semiconductor layer.

14. The method as recited in claim 11, further comprising forming contacts to connect to the source and drain regions, the contacts connecting to a top and side of the source and drain regions to reduce contact resistance.

15. The method as recited in claim 11, wherein forming the gate structure includes longitudinally extending the gate structure beyond the semiconductor layer to avoid electrical shorting.

16. The method as recited in claim 11, wherein the semiconductor layer includes an extremely thin semiconductor layer of an extremely thin semiconductor-on-insulator (ETSOI) structure.

17. The method as recited in claim 11, further comprising annealing the source and drain regions to drive dopants into the semiconductor layer.

18. The method as recited in claim 11, wherein forming the spacers includes defining a length of the semiconductor layer based on a thickness of the spacers.

19. The method as recited in claim 11, wherein forming the undercuts includes performing a selective etch to form the undercuts in the buried dielectric layer.

20. The method as recited in claim 11, wherein epitaxially growing includes growing a wrap-around structure for the source and drain regions with a low profile where a height of a top portion of the wrap-around structure is less than conventional raised source/drain regions.

\* \* \* \* \*